United States Patent
Bertsche

(10) Patent No.: US 7,276,694 B1
(45) Date of Patent: Oct. 2, 2007

(54) DEFECT DETECTION USING ENERGY SPECTROMETER

(75) Inventor: Kirk J. Bertsche, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/092,545

(22) Filed: Mar. 29, 2005

(51) Int. Cl.
*H01J 37/28* (2006.01)

(52) U.S. Cl. .......................... 250/311; 250/310; 250/305

(58) Field of Classification Search ................ 250/310, 250/397, 307, 306
See application file for complete search history.

(56) References Cited

U.S. PATENT DOCUMENTS

| | | | |
|---|---|---|---|
| 4,760,254 A * | 7/1988 | Pierce et al. ................. | 250/305 |
| 4,972,142 A * | 11/1990 | Brust .......................... | 324/751 |
| 6,038,018 A | 3/2000 | Yamazaki et al. | |
| 6,066,849 A | 5/2000 | Masnaghetti et al. | |
| 6,310,341 B1 | 10/2001 | Todokoro et al. | |
| 6,399,945 B1 * | 6/2002 | Hirayanagi .................. | 250/310 |
| 6,872,944 B2 * | 3/2005 | Todokoro et al. ........... | 250/310 |
| 6,949,745 B2 * | 9/2005 | Yonezawa ..................... | 250/311 |
| 6,992,287 B2 * | 1/2006 | Sullivan ...................... | 250/306 |
| 7,049,591 B2 * | 5/2006 | Todokoro et al. ........... | 250/310 |
| 2004/0051041 A1 * | 3/2004 | Todokoro et al. ........... | 250/310 |
| 2005/0133719 A1 * | 6/2005 | Todokoro et al. ........... | 250/310 |

* cited by examiner

*Primary Examiner*—Nikita Wells
*Assistant Examiner*—Johnnie L Smith, II
(74) *Attorney, Agent, or Firm*—Okamoto & Benedicto LLP

(57) ABSTRACT

One embodiment disclosed relates to an apparatus for detecting defects in substrates. An irradiation source is configured to generate an incident beam, and a lens system configured to focus the incident beam onto a target substrate so as to cause emission of electrons. A multiple-bin detector is configured to detect the emitted electrons, and each bin of the detector detects the emitted electrons within a range of energies. A processing system configured to process signals from the multiple-bin detector. Other embodiments are also disclosed.

19 Claims, 11 Drawing Sheets

100

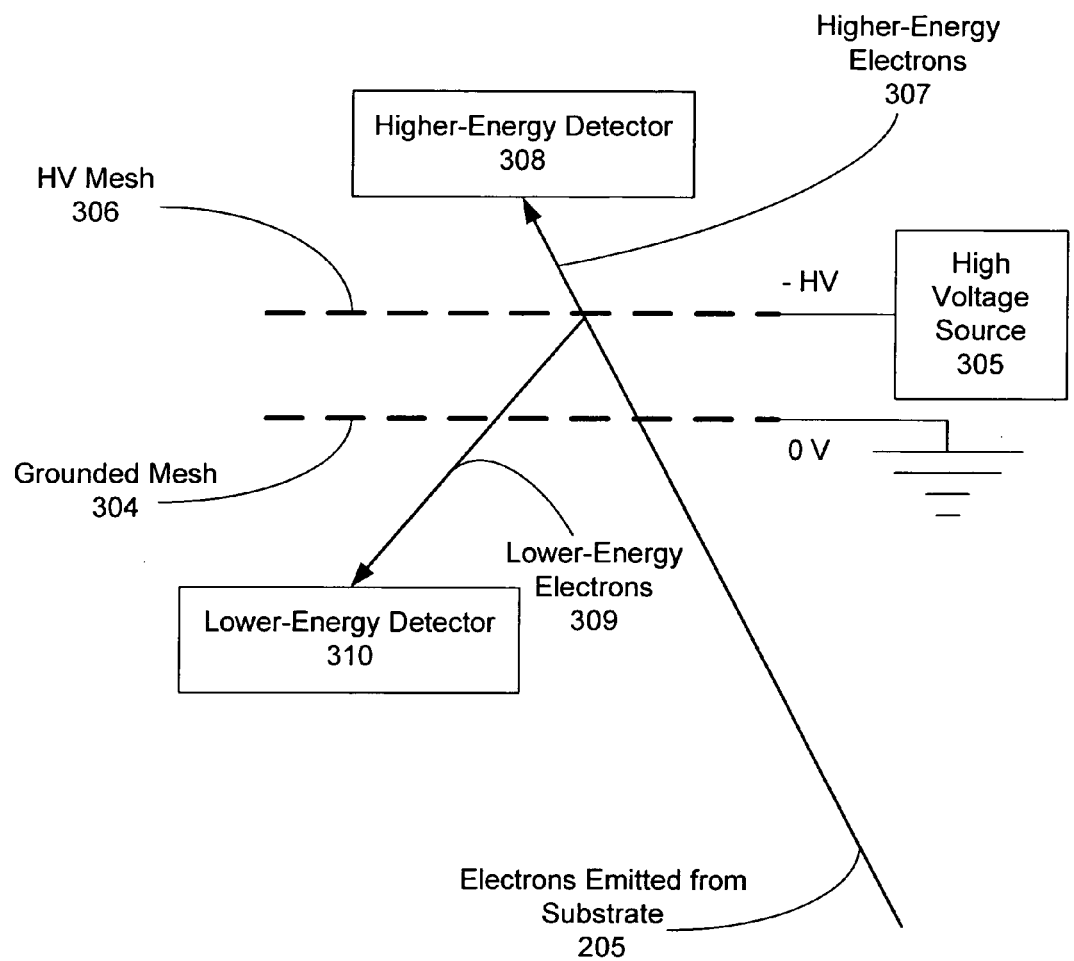
FIG. 3A        300

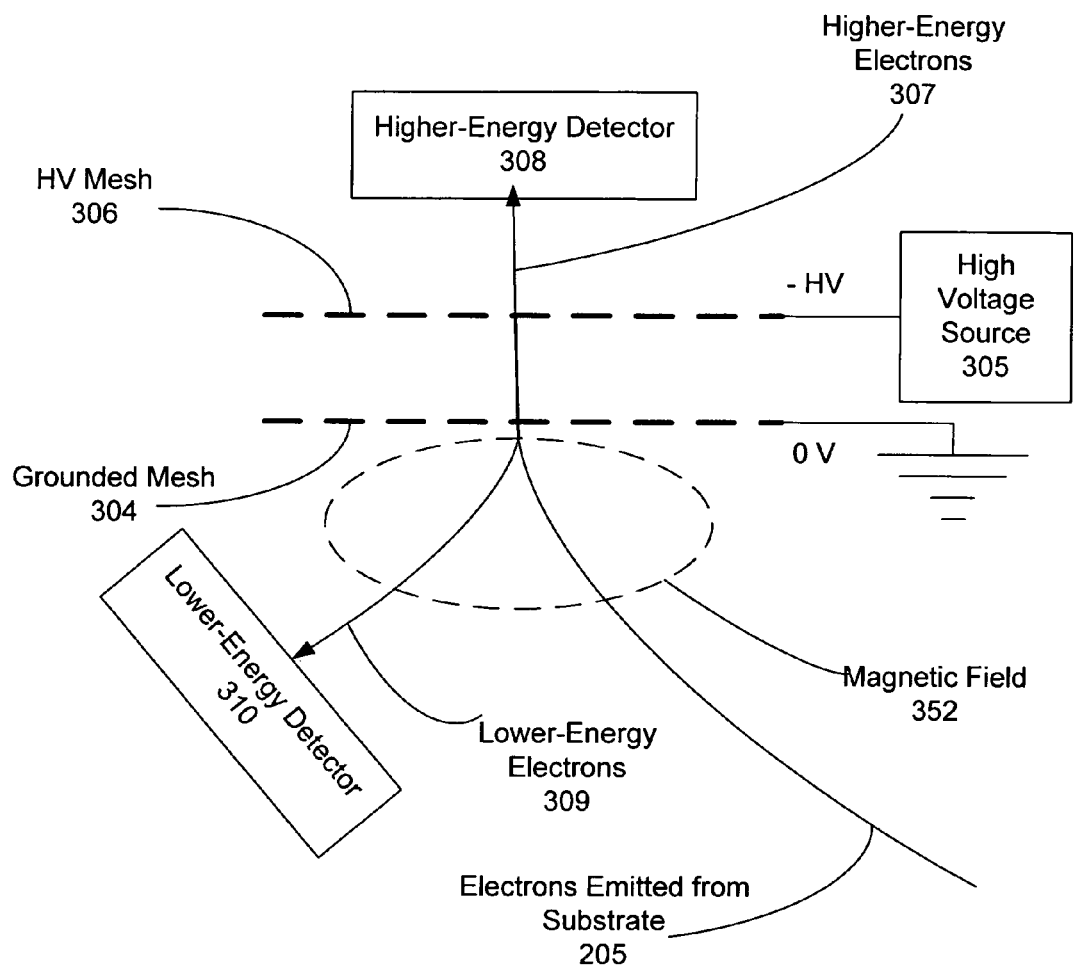
FIG. 3B       350

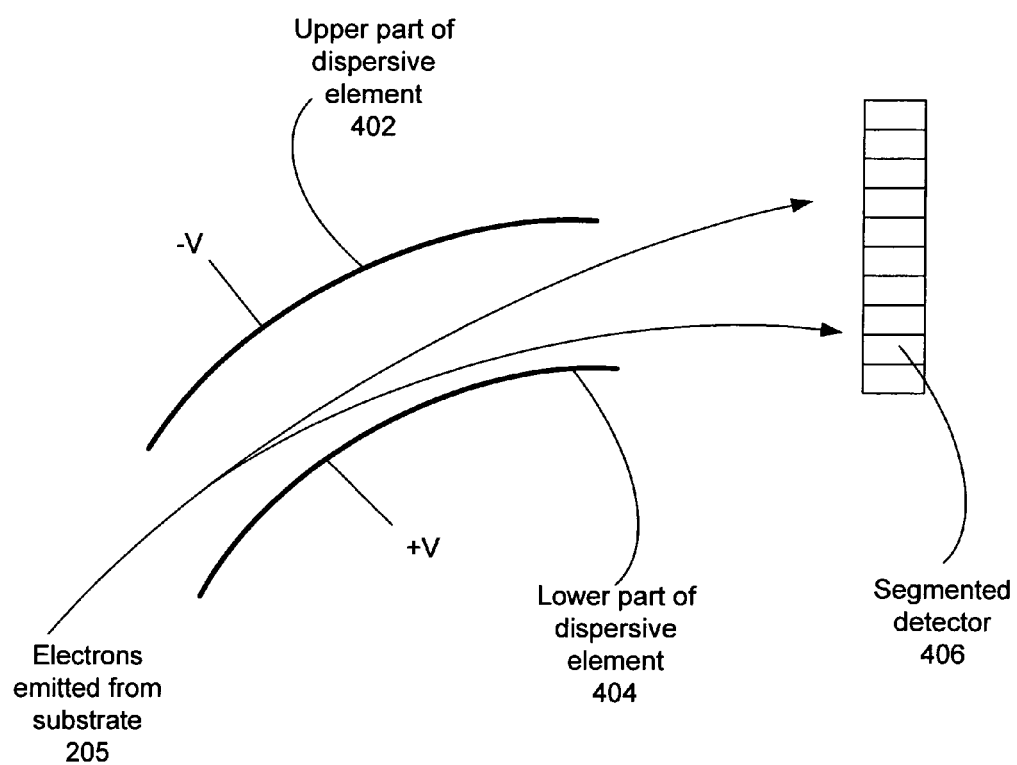
FIG. 4A            400

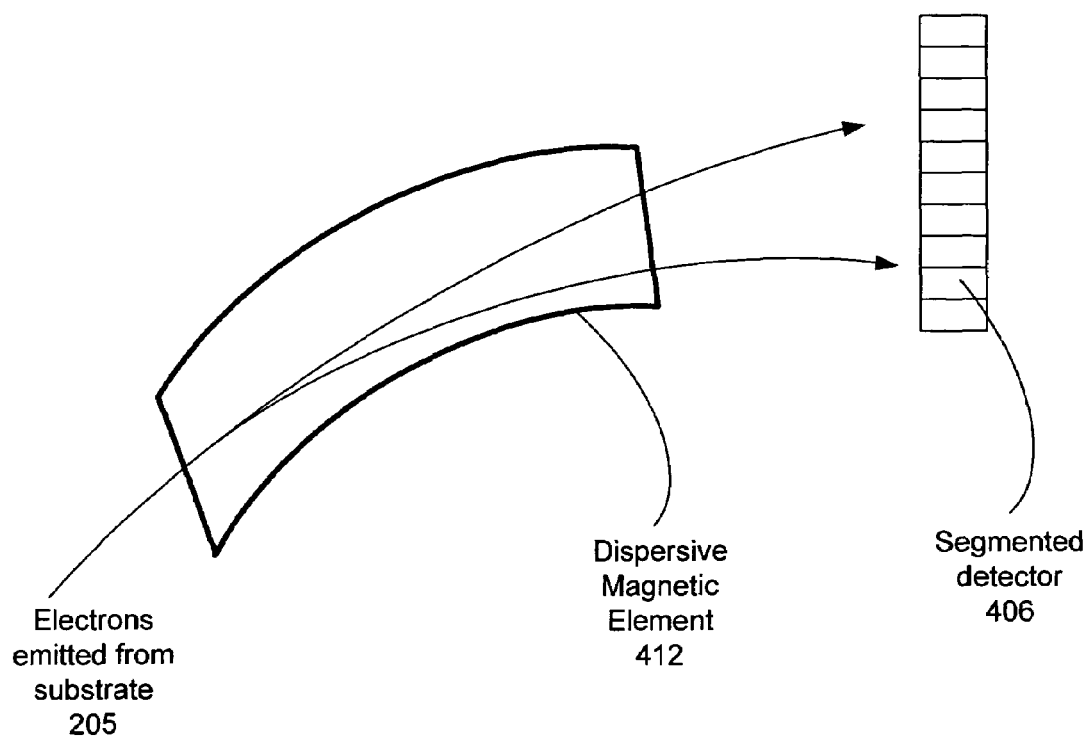
FIG. 4B    410

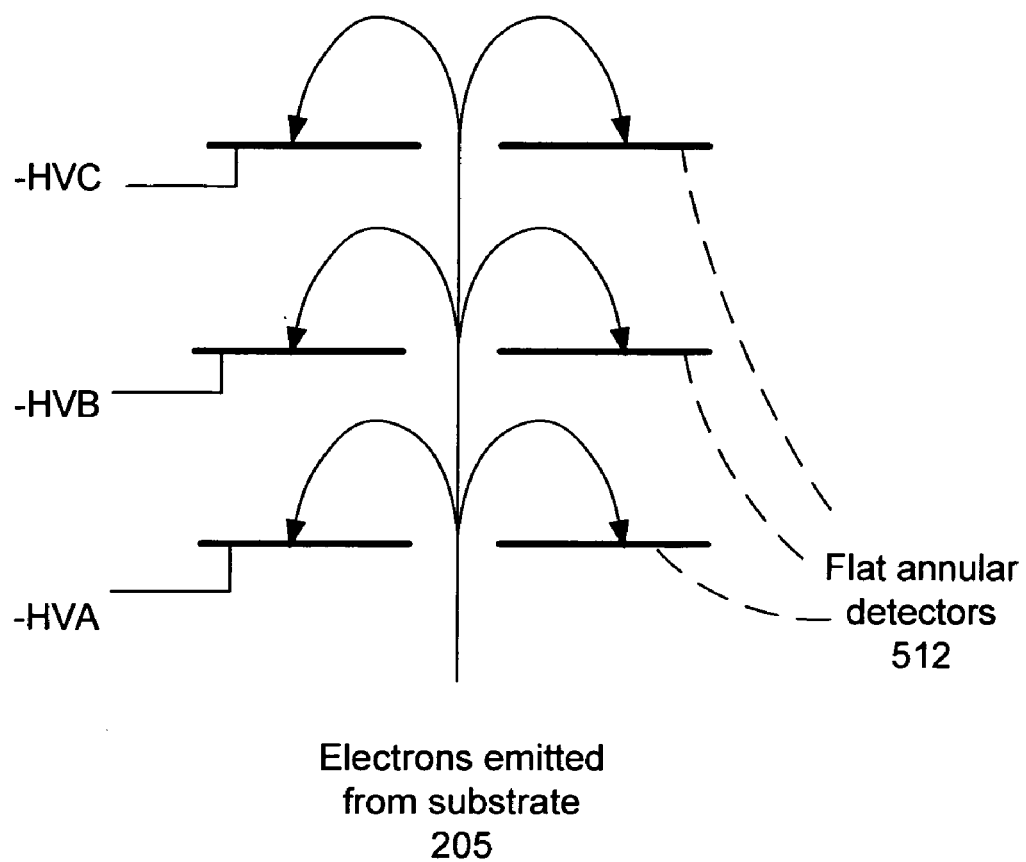
FIG. 5B     510

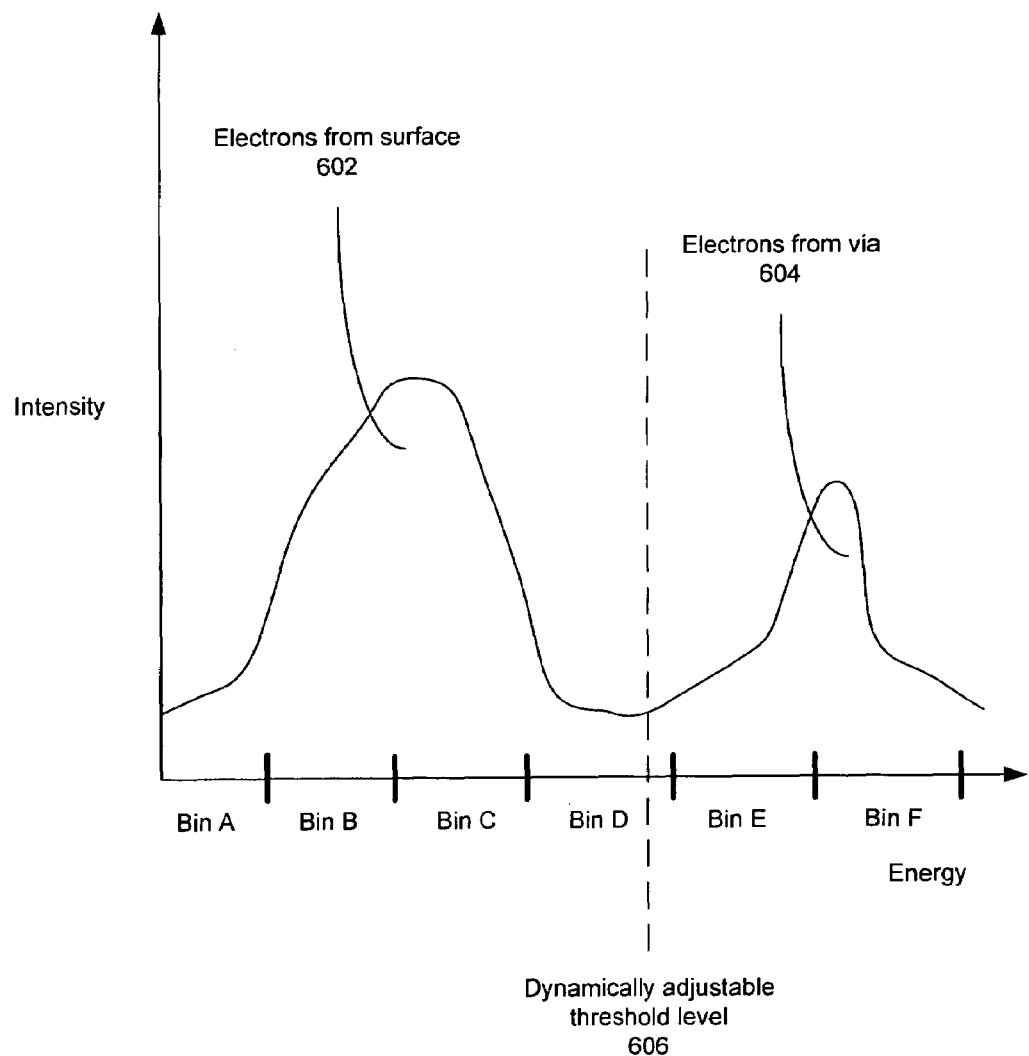
FIG. 6        600

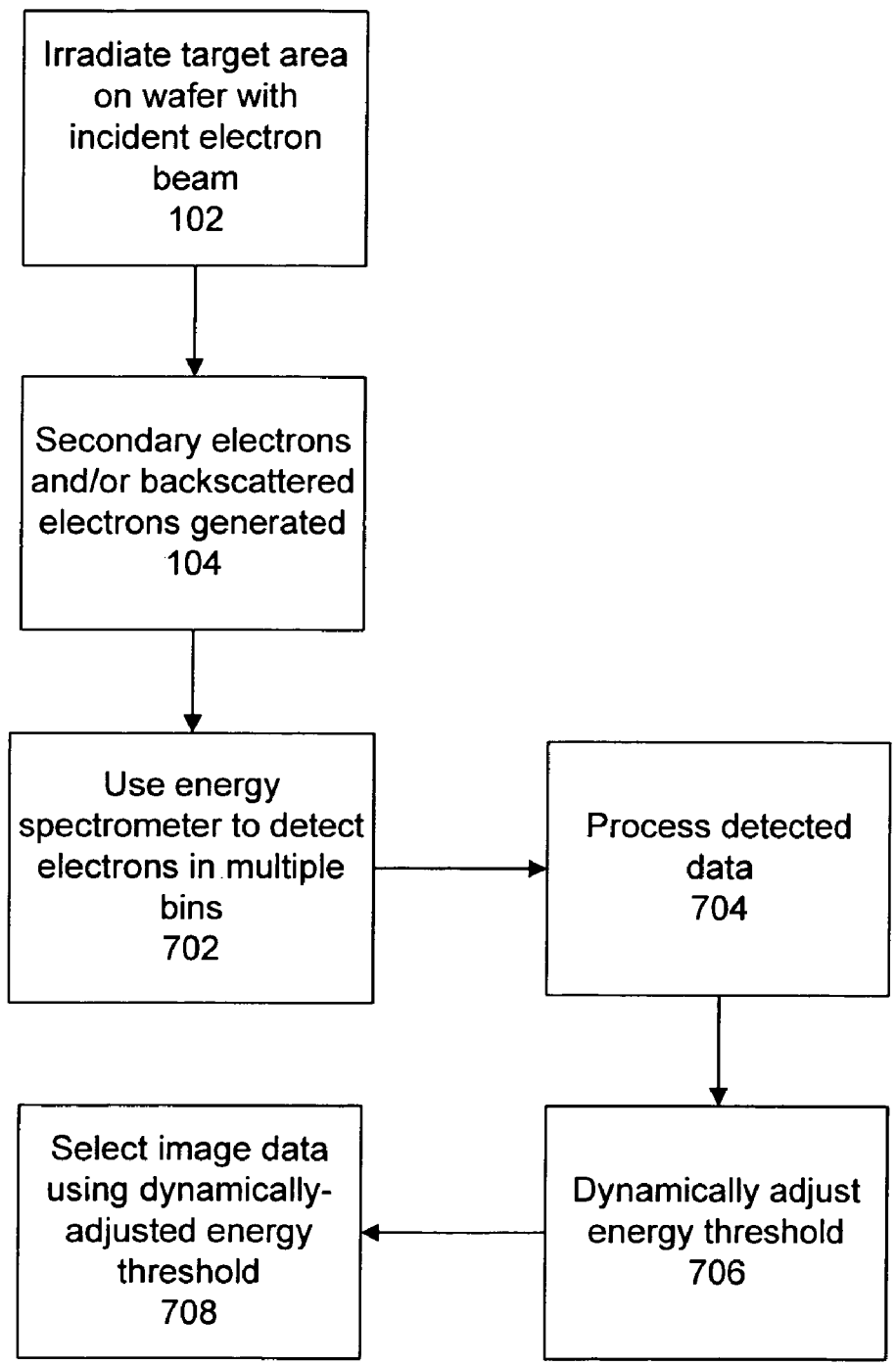
FIG. 7    700

DEFECT DETECTION USING ENERGY SPECTROMETER

BACKGROUND OF THE INVENTION

1. Field of the Invention

The present invention relates generally to charged-particle apparatus for inspection and/or review and/or metrology of semiconductor wafers and other substrates.

2. Description of the Background Art

The detected signal in electron microscopes is typically a sum of secondary electrons and backscattered electrons. In some systems, the secondary electrons and backscattered electrons are separated and sent to different detectors. In some systems, the secondary electrons are subject to a threshold energy filter, with lower energies being discarded and higher energies being counted.

The use of such a threshold energy filter with a secondary electron detector has proved to be useful in enhancing the sensitivity to certain defect types in wafer inspection. This is because the secondary electrons from a wafer have energy modulation due to wafer features.

FIG. 1 is a flow chart depicting a conventional method 100 of detecting electrons using threshold energy filtering in a defect detection system. A target area on a wafer (or other substrate of interest) is irradiated 102 with an incident electron (charged-particle) beam. Due to the irradiation of the incident beam onto the substrate, secondary electrons and/or backscattered electrons are generated 104. Prior to detection of the secondary and/or backscattered electrons, a threshold energy filter is applied 106. The threshold energy filtering prevents those electrons with energies below a threshold energy level from being detected. Only the secondary and/or backscattered electrons with energies above the threshold energy level are detected and analyzed 108.

FIG. 2 schematically depicts an example conventional scanning electron microscope (SEM) system 200. The SEM system 200 includes a multiplexer control system 250 arranged to receive a plurality of multiplexer control signals and to output a plurality of image control signals to an electron beam generator subsystem (including, for example, an electron source 202, a suppressor 204, an extractor 206, an electrostatic lens 208, a gun valve 210, an upper quadrupole 211, a lower quadrupole 212, an aperture 213, a Faraday cup 214, a Wien filter 218, a magnetic lens 219, and a lower octopole 220).

The electron beam generator subsystem is arranged to receive the plurality of image control signals and to generate an electron beam 203 that is directed substantially toward an area of interest on the specimen 222. The SEM system 200 also includes a detector subsystem arranged to detect charged particles 205 emitted from the specimen 222 to allow generation of an image from the detected charged particles, which particles may include secondary electrons and/or backscattered electrons.

The detector subsystem may include an energy filter and ground mesh 223, and detector 228. The energy filter and ground mesh 223 may be arranged to select between secondary and backscattered electrons. If a high negative potential is applied to the energy filter 223, it is likely that backscattered electrons will only reach the detector 228 since backscattered electrons typically have a much higher energy value than the secondary electrons.

Once the electrons are detected by the detector 228, an image generator (for example, including analog-to-digital circuit 234 for converting the detected signal into a digital signal, a de-multiplexer circuit 236 for separating the setup phase data and image phase data, setup frame buffer 238, image frame buffer 240, and CPU 242 for processing the image frame data, among other components) is arranged to receive the detected signal 232 and generate and/or store an image data. For example, successive image frame data may be averaged together to create the image. Alternatively, the setup frame data may be utilized to generate an image.

The SEM system 200 may be implemented so as to include a multiplexer control system 250 in a form suitable for multiplexing SEM operating parameters. The multiplexer control system 250 may include a plurality of multiplexer control blocks.

BRIEF DESCRIPTION OF THE DRAWINGS

FIG. 3A is a schematic diagram of a dual bin electron detector for use within a defect detection or metrology system in accordance with an embodiment of the invention.

FIG. 3B is a schematic diagram of another dual bin electron detector for use within a defect detection or metrology system in accordance with an embodiment of the invention.

FIG. 4A is a schematic diagram of a multiple-bin electron detector (an energy spectrometer) having an electrostatic dispersive element for use within a defect detection or metrology system in accordance with an embodiment of the invention.

FIG. 4B is a schematic diagram of a multiple-bin electron detector (an energy spectrometer) having a magnetic dispersive element for use within a defect detection or metrology system in accordance with an embodiment of the invention.

FIG. 5B is a schematic diagram of a second multi-bin detector for use within a defect detection or metrology system in accordance with an embodiment of the invention.

FIG. 6 is a hypothetical example energy distribution of scattered electrons for purposes of discussion.

FIG. 7 is a flow chart depicting a method of detecting electrons using an energy spectrometer in a defect detection or metrology system in accordance with an embodiment of the invention.

SUMMARY

Figure 1:
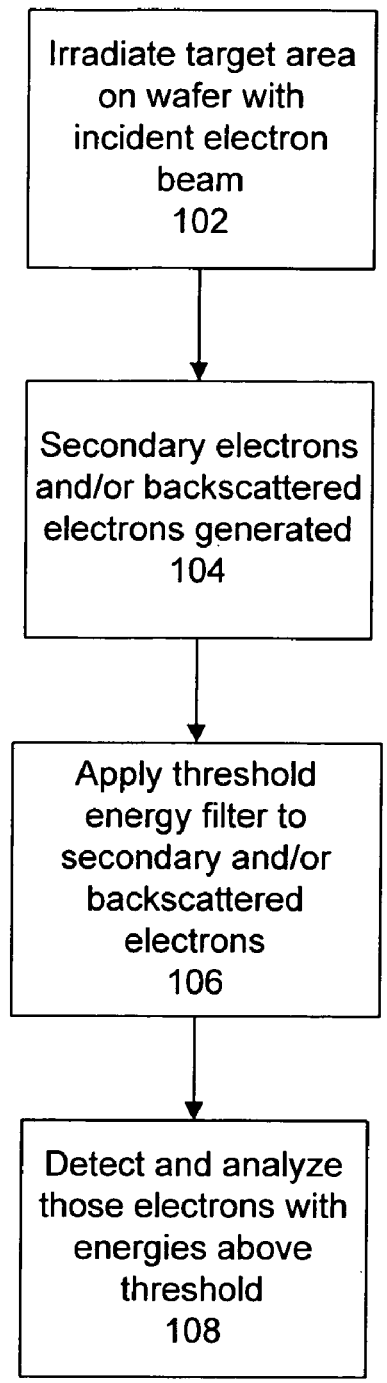
FIG. 1 is a flow chart depicting a conventional method of detecting electrons using threshold energy filtering in a defect detection system.
Figure 2:
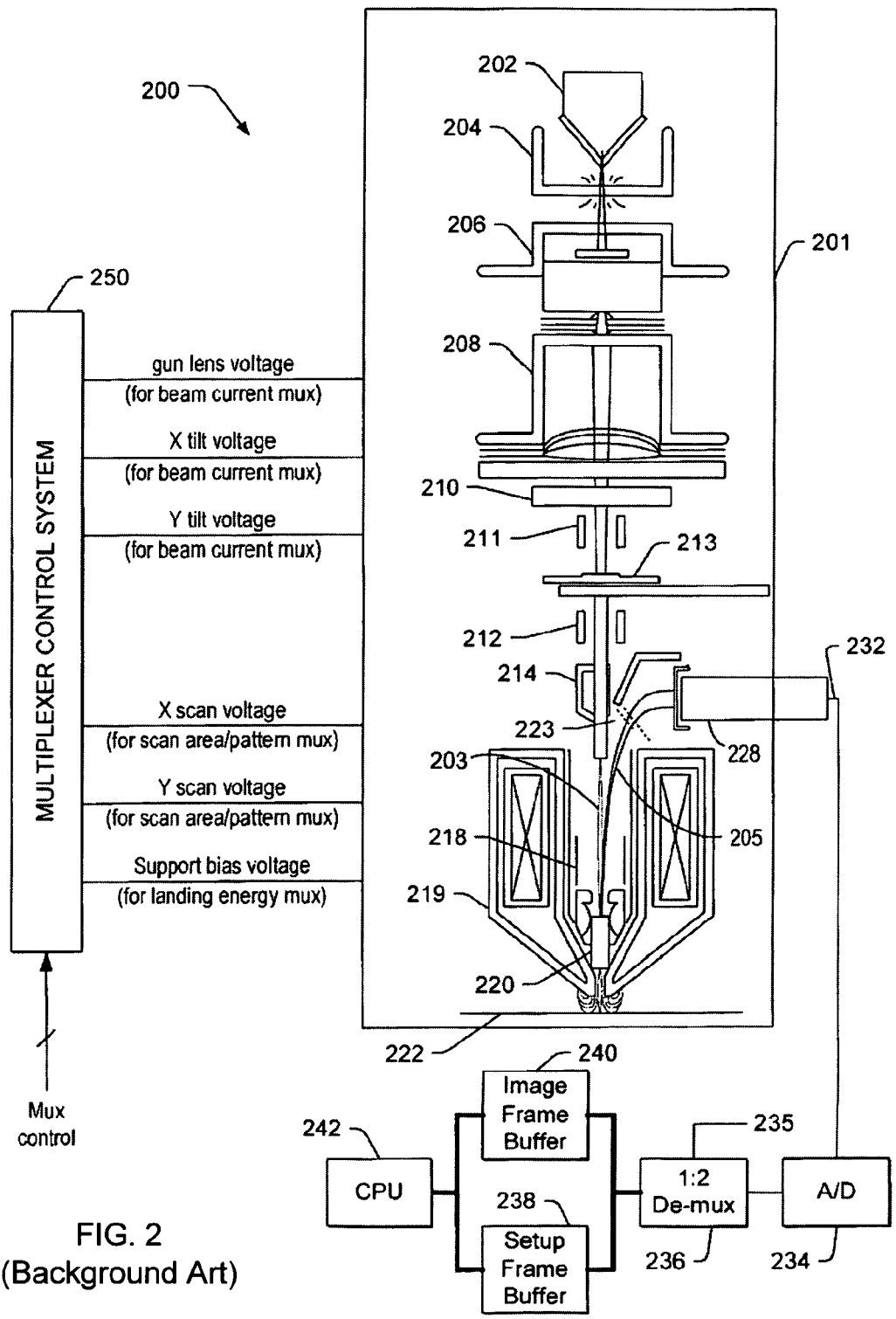
FIG. 2 schematically depicts an example conventional scanning electron microscope (SEM) system.

One embodiment of the invention pertains to an apparatus for detecting defects in substrates. An irradiation source is configured to generate an incident beam, and a lens system configured to focus the incident beam onto a target substrate so as to cause emission of electrons. A multiple-bin detector is configured to detect the emitted electrons, and each bin of the detector detects the emitted electrons within a range of energies. A processing system configured to process signals from the multiple-bin detector.

Another embodiment pertains to a method of imaging defects in substrates. An incident beam of irradiation is generated and focused onto a target substrate so as to cause emission of electrons. The emitted electrons are detected in multiple energy bins, wherein each energy bin counts the emitted electrons within a range of energies. The signals from the multiple energy bins are processed.

Other embodiments are also disclosed.

DETAILED DESCRIPTION

As discussed above, threshold energy filters are sometimes used with secondary electron detectors to enhance sensitivity to certain wafer defect types. However, the use of such threshold energy filters includes some shortcomings and disadvantages.

First, such threshold energy filters discard (do not count) lower energy electrons, and by doing so lose potentially useful information. Second, the wafer charge level often changes as a function of position on the wafer. If so, then the effective cutoff energy for the secondary electrons shifts, reducing the efficacy of the energy filtering, unless the energy threshold is dynamically adapted.

The present application discloses the use of an energy spectrometer in electron beam inspection, review and/or metrology tools. The use of such an energy spectrometer, instead of a threshold energy filter, comprises an enhancement to the conventional systems.

Previously, energy spectrometers have been provided in various research microscopes, but they have not been utilized for the purposes disclosed herein in production inspection or metrology tools. However, as disclosed herein, an energy spectrometer with two or more "bins" (rather than a threshold energy filter) may be advantageously utilized in conjunction with an electron detector in a defect detection (or metrology) system.

For example, the signals from the various energy bins in the spectrometer may be used to derive a measurement of the charge state of a substrate or wafer. Hence, the energy spectrometer may be used to implement adaptive thresholding, where the threshold energy is made to dynamically vary to take into account changes in wafer or charge characteristics. As another example, multiple energy thresholds may be implemented using an energy spectrometer. In addition, post-processing techniques may be applied to the data obtained from the energy spectrometer so as to select the best or superior threshold arrangements.

FIG. 3A is a schematic diagram of a dual-bin electron detector 300 for use within a defect detection or metrology system in accordance with an embodiment of the invention. The secondary and/or backscattered electrons 205 emitted from the substrate enter into the detector 300. In this embodiment, a grounded mesh 304 and a high voltage mesh 306 are utilized to separate the emitted electrons 205 depending on their energies.

The grounded mesh 304 is electrically grounded, while a negative high voltage level (–HV) from a high voltage source 305 is applied to the high voltage mesh 306. Configured in this way, the meshes effectively separate those emitted electrons with higher energies from those with lower energies. The higher-energy electrons 307 have sufficient energy to pass the high voltage mesh 306 and so reach and are detected by a higher-energy detector 308. The lower-energy electrons 309 do not have sufficient energy to pass the high voltage mesh 306 and so are collected and detected by a lower-energy detector 310.

FIG. 3B is a schematic diagram of another dual-bin electron detector 350 for use within a defect detection system in accordance with an embodiment of the invention. In this embodiment, a magnetic field 352 is configured in a region in the detector 350 such that the electrons 205 entering the detector 350 have their trajectories bent towards the energy-filtering mechanism (304 and 306) and the higher-energy detector 308. The lower energy electrons 309 without sufficient energy to pass the energy-filtering mechanism (304 and 306) have their trajectories bent by the magnetic field 352 towards the lower-energy detector 310.

FIG. 4A is a schematic diagram of an energy spectrometer 400 having an electrostatic dispersive element for use within a defect detection or metrology system in accordance with an embodiment of the invention. In this embodiment, the electrons 205 emitted from the substrate enter an energy dispersive element in the spectrometer 400. The energy dispersive element may be implemented as an electrostatic dispersive element, a magnetic dispersive element, or a combined electric/magnetic dispersive element. In FIG. 4A, an electrostatic dispersive sector is shown, including an upper electrode part 402 with a negative voltage applied thereto and a lower electrode part 404 with a positive voltage applied thereto. The upper 402 and lower 404 electrodes are configured with a bend such that those electrons with a higher energy (and hence a higher speed) have their trajectories bent less than those electrons having a lower energy (and hence a lower speed). This results in a dispersion of the electrons. The dispersed electrons may be detected by a segmented detector 406 so as to form an energy spectrum of the detected electrons.

FIG. 4B is a schematic diagram of an energy spectrometer 410 having a magnetic dispersive element 412 for use within a defect detection or metrology system in accordance with an embodiment of the invention. The magnetic dispersive element 412 may be configured, for example with a magnetic dipole arrangement, such that those electrons with a higher energy (and hence a higher speed) have their trajectories bent less than those electrons having a lower energy (and hence a lower speed).

Figure 5A:
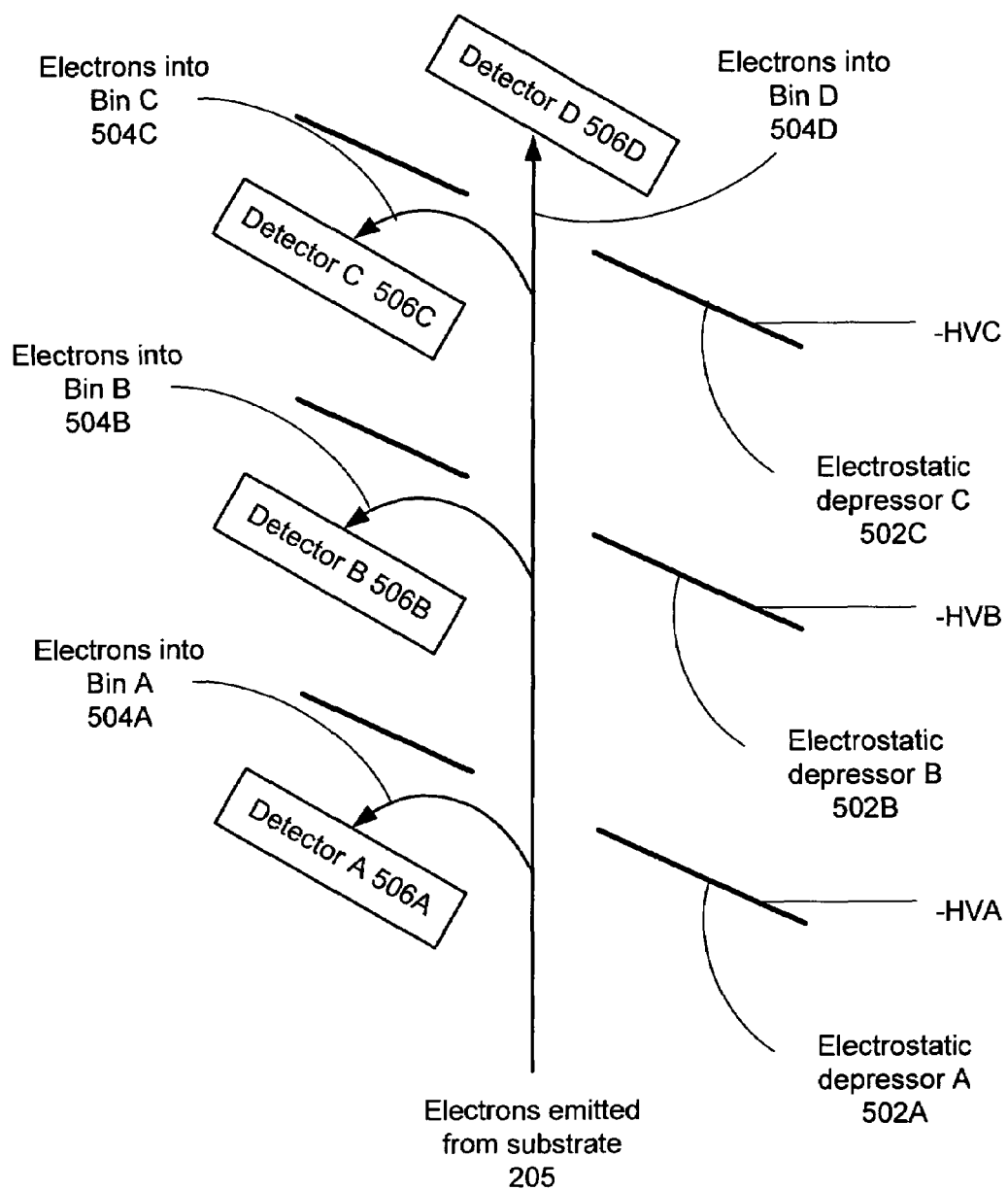
FIG. 5A is a schematic diagram of a spectrometer for use within a defect detection or metrology system in accordance with an embodiment of the invention.

FIG. 5A is a schematic diagram of a multi-bin detector 500 for use within a defect detection or metrology system in accordance with an embodiment of the invention. In this embodiment, the detector 500 has a plurality of electrostatic depressors 502. The first electrostatic depressor 502A has a first negative high voltage level (–HVA) applied thereto. The second electrostatic depressor 502B has a second negative high voltage level (–HVB) applied thereto. The third electrostatic depressor 502C has a third negative high voltage level (–HVC) applied thereto. While three such depressors 502 are shown in FIG. 5, other implementations may include more or fewer such depressors 502 (and hence more or fewer energy bins). The second voltage level (–HVB) is more negative than the first voltage level (–HVA). The third voltage level (–HVC) is more negative than the second voltage level (–HVB). And so on, if there are more depressors 502.

The electrons 205 emitted from the substrate enter the detector 500. Those electrons 504A with insufficient energy to pass the first electrostatic depressor 502A are deflected into a first detector 506A which detects electrons for a first energy bin. Those electrons 504B with insufficient energy to pass the second electrostatic depressor 502B are deflected into a second detector 506B which detects electrons for a second energy bin. Those electrons 504C with insufficient energy to pass the third electrostatic depressor 502C are deflected into a third detector 506C which detects electrons for a third energy bin. The electrons 504D with sufficient energy to pass the last electrostatic depressor 502C are detected by a last detector 506D.

FIG. 5B is a schematic (cross-sectional) diagram of a second multi-bin detector 510 for use within a defect detection or metrology system in accordance with an embodiment of the invention. In this embodiment, the detector 510 is configured with flat annular coaxial detectors 512.

Figure 5C:
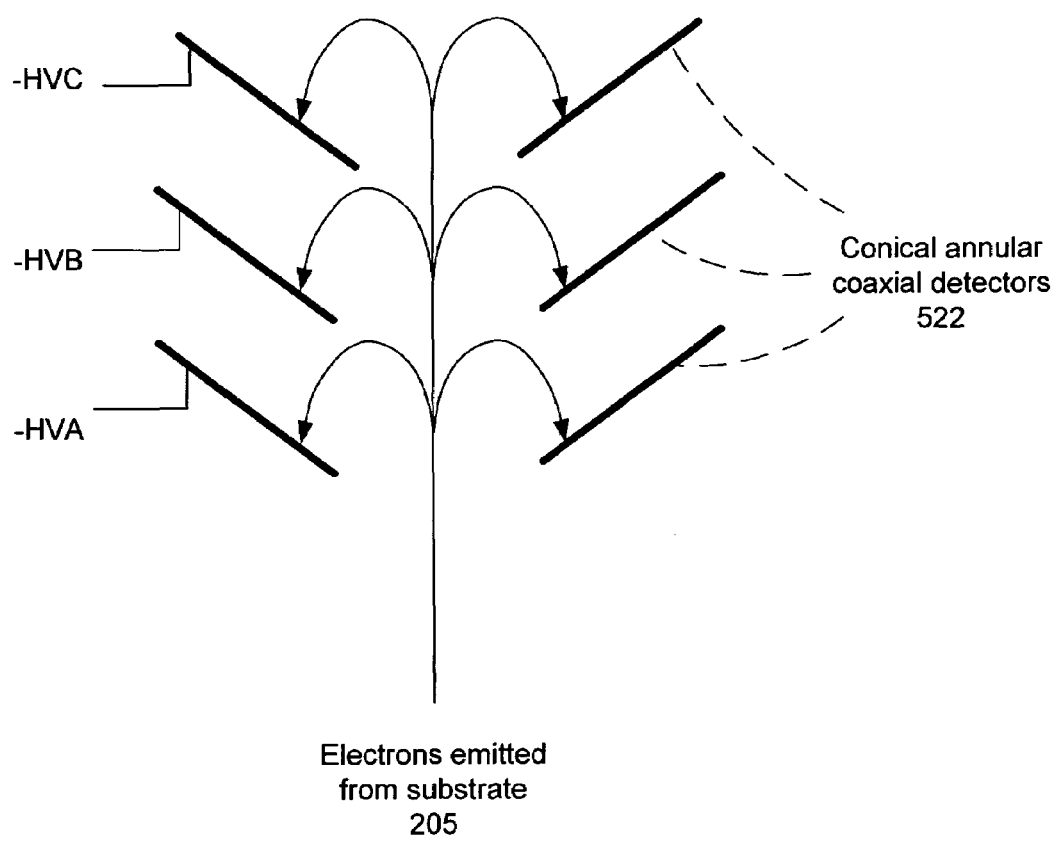
FIG. 5C is a schematic diagram of a second multi-bin detector for use within a defect detection or metrology system in accordance with an embodiment of the invention.

FIG. 5C is a schematic (cross-sectional) diagram of a third multi-bin detector 520 for use within a defect detection or metrology system in accordance with an embodiment of the invention. In this embodiment, the detector 520 is configured with conical annular coaxial detectors 522.

FIG. 6 is a hypothetical example energy distribution 600 of scattered electrons for purposes of discussion. In this hypothetical example, the semiconductor wafer (or substrate) includes a main surface portion and vias (or contact holes) that go to a lower level beneath the surface. In this example, those secondary electrons emitted from the wafer surface are distributed around a first peak 602 at lower energies than those secondary electrons emitted from the vias which are distributed around a second peak 604 at higher energies.

In FIG. 6, a dynamically adjustable threshold level 606 is also shown. For example, this threshold level 606 may be utilized to form an image with electrons from the surface (by using those electrons with energies below the threshold level 606 to form the image), or to form an image with electrons from the vias (by using those electrons with energies above the threshold level 606 to form the image).

Several energy bins (each with a different energy range) are also shown in FIG. 6. Intensity data of electrons collected in these bins may be processed, for example, to dynamically adjust the threshold level 606. For example, a measure of the average energy of the electrons from the surface 602 may be determined by keeping track of the intensity in Bin B relative to the intensity in Bin C of FIG. 6. Shifts in the average energy of electrons from the surface may be used to deduce shifts in surface charge. In accordance with one embodiment of the invention, the threshold level 606 may be dynamically shifted in correspondence with the shifts in the average energy of electrons from the surface.

FIG. 7 is a flow chart depicting a method 700 of detecting electrons using an energy spectrometer in a defect detection system in accordance with an embodiment of the invention. As in the conventional method 100 discussed above, a target area on a wafer (or other substrate of interest) is irradiated 102 with an incident electron (charged-particle) beam. Due the irradiation of the incident beam onto the substrate, secondary electrons and/or backscattered electrons are generated 104.

However, instead of applying 106 a threshold energy filter, an energy spectrometer is used to detect 702 secondary and/or backscattered electrons in multiple bins. Examples of such multiple energy bin detectors are discussed above in relation to FIGS. 3A, 3B, 4, and 5. The multiple bin detected data is processed 704 and may be used, for example, to dynamically adjust 706 an energy threshold value. Image data may be selected 708 based on this dynamically-adjusted energy threshold so as to advantageously form images that enhance defect detection.

The above-described diagrams are not necessarily to scale and are intended be illustrative and not limiting to a particular implementation. The above-described invention may be used, for example, in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for detecting defects in substrates, the apparatus comprising:
   an irradiation source configured to generate an incident beam;
   a lens system configured to focus the incident beam onto a target substrate so as to cause emission of electrons;
   a multiple-bin detector configured to detect the emitted electrons directly from the target substrate, wherein each bin of the detector detects the emitted electrons within a range of energies; and
   a processing system configured to process signals from the multiple-bin detector.

2. The apparatus of claim 1, wherein the multiple-bin detector comprises a higher-energy detector, a lower-energy detector, and an energy filter, wherein the detector is configured such that electrons with sufficiently high energy to pass the energy filter are detected by the higher-energy detector, and wherein the detector is configured such that electrons without sufficient energy to pass the energy filter are detected by the lower-energy detector.

3. The apparatus of claim 2, wherein the energy filter comprises a first conductive mesh and a second conductive mesh, wherein the second conductive mesh is at a voltage level more negative than the first conductive mesh.

4. The apparatus of claim 2, wherein the multiple-bin detector further comprises a mechanism to generate a magnetic field, and wherein the magnetic field is configured to direct the emitted electrons towards the energy filter and to direct the electrons without sufficient energy to pass the energy filter towards the lower-energy detector.

5. The apparatus of claim 1, wherein the multiple-bin detector comprises an energy dispersive element configured to disperse trajectories of the emitted electrons based upon the energies of the emitted electrons.

6. The apparatus of claim 5, wherein the energy dispersive element comprises an electrostatic dispersive element.

7. The apparatus of claim 5, wherein the energy dispersive element comprises an magnetic dispersive element.

8. The apparatus of claim 5, wherein the energy dispersive element comprises combined electric and magnetic elements.

9. The apparatus of claim 5, wherein the multiple-bin detector further comprises a segmented detector configured to receive the emitted electrons.

10. The apparatus of claim 1, wherein the multiple-bin detector comprises a plurality of electrostatic depressors, and wherein each electrostatic depressor is configured to redirect those emitted electrons with insufficient energy to pass the depressor towards a corresponding detector unit.

11. The apparatus of claim 1, wherein the apparatus comprises equipment for automated inspection of the substrates in a semiconductor manufacturing environment.

12. The apparatus of claim 1, wherein the apparatus comprises equipment for metrology of features on a semiconductor wafer.

13. The apparatus of claim 1, wherein the apparatus comprises equipment for defect review of semiconductor wafers.

14. A method of imaging defects in substrates, the method comprising:
  generating an incident beam of irradiation;
  focusing the incident beam onto a target substrate so as to cause emission of electrons;
  detecting the emitted electrons directly from the target substrate into multiple energy bins, wherein each energy bin counts the emitted electrons within a range of energies; and
  processing signals from the multiple energy bins,
  wherein said processing includes determining an indication of a shift in surface charge.

15. The method of claim 14, wherein the shift in surface charge is used to dynamically adjust an energy threshold level.

16. The method of claim 15, wherein image data is selected using the dynamically-adjusted energy threshold level.

17. An automated inspection apparatus for detecting defects in substrates, the apparatus comprising:
  means for creating an incident beam of irradiation;
  means for impinging the incident beam onto a target substrate so as to cause emission of electrons;
  means for detection of the emitted electrons directly from the target substrate into multiple energy bins, wherein each energy bin counts the emitted electrons within a range of electron energies; and
  means for processing data signals derived from the multiple energy bins,
  wherein the means for processing is configured to determine an indication of a shift in surface charge.

18. The apparatus of claim 17, wherein the apparatus is configured to use the shift in surface charge to dynamically adjust an energy threshold level.

19. The apparatus of claim 18, wherein the apparatus is further configured to select image data using the dynamically-adjusted energy threshold level.

* * * * *